United States Patent [19]
Yokoyama

[11] 4,115,742
[45] Sep. 19, 1978

[54] VARIABLE LOAD LINE POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 778,927

[22] Filed: Mar. 18, 1977

[30] Foreign Application Priority Data

Mar. 18, 1976 [JP] Japan .................. 51/28659

[51] Int. Cl.² ............................. H03F 3/04
[52] U.S. Cl. .................. 330/297; 330/267; 330/273
[58] Field of Search ............ 330/263, 267, 273, 297

[56] References Cited

U.S. PATENT DOCUMENTS

| | | | |
|---|---|---|---|
| 3,772,606 | 11/1973 | Waener | 330/22 X |
| 3,858,119 | 12/1974 | Engelhardt | 330/297 X |
| 4,001,707 | 1/1977 | Iguchi | 330/18 |
| 4,027,270 | 5/1977 | Pitel | 330/273 |

*Primary Examiner*—Lawrence J. Dahl
*Attorney, Agent, or Firm*—Cushman, Darby & Cushman

[57] ABSTRACT

An emitter follower type power amplifier capable of changing over supply voltage and hence the load line, comprising: an amplifying transistor of saturating type; at least a first and a second supply voltage source; a switching transistor having, a collector connected to the first supply voltage source, and an emitter connected to the second supply voltage source via a diode and also to the collector of said power amplifying transistor; a load resistor connected between the emitter of the power amplifying transistor and the ground; and a biasing voltage source connected between the base of the switching transistor and the emitter of the power amplifying transistor. This power amplifier circuit arrangement allows switching-over between load lines for small signal region and large signal region thereby enabling large signal amplification and reducing the collector loss of the power amplifying transistor. This circuit arrangement is also used in a push-pull power amplifying circuit to obtain the same advantage.

11 Claims, 4 Drawing Figures

4,115,742

VARIABLE LOAD LINE POWER AMPLIFIER

BACKGROUND OF THE INVENTION (a) Field of the Invention

The present invention is concerned with a power amplifying circuit and more particularly, it relates to a power amplifier capable of changing over the supply voltage and thereby shifting the load line.

(b) Description of the Prior Art

Discussion will hereunder be made on the conventional emitter follower power amplifier by referring to FIG. 1. FIG. 1 shows a known single-ended push-pull power amplifying circuit of the emitter follower type. The respective emitters of the transistors $Q_1$ and $Q_2$ are connected to one end of a load resistor $R_L$ through respective resistors $R_{e1}$ and $R_{e2}$ having small resistances intended for the prevention of excessive current flow and for a stabilization of operation. The other end of the load $R_L$ is grounded. The respective collectors of these two transistors $Q_1$ and $Q_2$ are connected to a positive and a negative supply voltage source $+V_1$ and $-V_1$, respectively. The respective bases of the transistors $Q_1$ and $Q_2$ are applied with an input signal $e_i$ via a positive and a negative biasing voltage source $+E_b$ and $-E_b$, respectively. In order to increase the peak output power in the above-mentioned power amplifying circuit, it is necessary to elevate the voltages of the supply voltage sources $+V_1$ and $-V_1$ in order to obtain a broader operative range. However, in case the voltages of the supply voltage sources $+V_1$ and $-V_1$ are elevated, the collector-emitter voltage between the transistors $Q_1$ and $Q_2$ relative to a certain load current will become higher, so that the collector loss, i.e., the power loss due to the collector current, will become increased.

Let us now refer to FIG. 2 which shows schematic characteristic curves of an amplifying transistor.

The ordinate represents the collector current and the abscissa represents the collector-to-emitter voltage. As shown in the figure, the current curves are assumed to take a constant value in the active region. Lines $l_1$ and $l_2$ represent examples of load line for a low and a high supply voltage $V_1$ and $V_2$. When the supply voltage is low at $V_1$, the collector-to-emitter voltage is low and hence the power loss in the element is small. When a large input signal is supplied, however, the output current may be clipped at point F as shown by the dotted line on the left. To allow large signals to be amplified without distortion, the load line should be shifted rightwards. Namely, the supply voltage should be increased. The load line $l_2$ represents the case under such increased supply voltage $V_2$ with the same load resistance. In this case, the operative region may be expanded to $\overline{DE}$ compared to $\overline{BA}$ on the line $l_1$. Thus, large signal amplification is made possible. In such case, however, the power loss in the element increases. Namely, for the similar output current $I_c$, the power consumed in the element is $I_c \cdot (V_2)$ for the load line $l_2$ in contrast to $I_c \cdot V_1$ for the load line $l_1$. Thus, the power loss is increased by $I_c \cdot (V_2 - V_1)$ for providing the same output current. In this way, according to the conventional power amplifier, large output current and low power consumption have been the contradicting problems.

SUMMARY OF THE INVENTION

It is, therefore, a primary object of the present invention to provide a power amplifying circuit which is capable of deriving a large output power with a reduced power consumption.

Another object of the present invention is to provide a power amplifying circuit of the type as stated above, which is arranged to be operative so that in case the input signal level is low, the supply voltage level of the power amplifying transistor is lowered, whereas when this input signal level becomes high, the supply voltge of the power amplifying transistor is elevated to derive a sufficiently large output power, to thereby substantially reduce the collector loss of the power amplifying transistor.

Still another object of the present invention is to provide a single-ended push-pull power amplifying circuit of the emitter-follower type using the power amplifying circuit arrangement of the present invention mentioned above.

These as well as other objects and the features of the present invention will become apparent by reading the following description of the preferred embodiments when taken in conjunction with the accompanying drawings.

In view of the inconveniences and the drawbacks of the known power amplifying circuit, the present inventor paid particular attention to the fact that the collector (or emitter) current does not vary in the active region regardless of the collector-to-emitter voltage when the input signal, i.e. the base bias voltage is at a constant value as can be seen by the horizontal characteristic curves in FIG. 2. Thus, the inventor conceived to carry out the change-over between the supply voltage levels to supress the loss of power in the power amplifying transistor to a substantially low level.

DETAILED DESCRIPTION OF THE PREFERRED EMBODIMENTS

Figure 1:
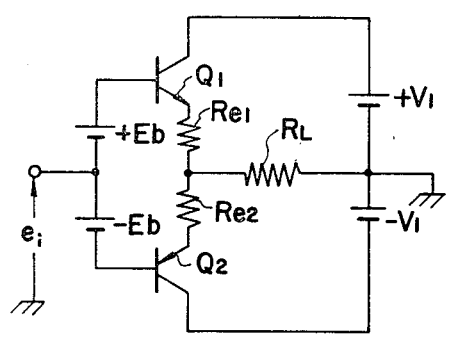
FIG. 1 is a circuit diagram showing an example of the prior art power amplifying circuit.
Figure 3:
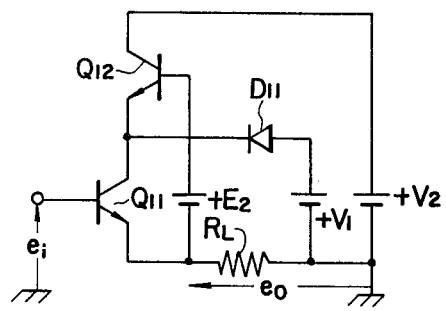
FIG. 3 is a circuit diagram showing an embodiment of the single power amplifying circuit according to the present invention.

An example of the present invention will hereunder be explained by referring to FIG. 3. In this figure, there is shown a single power amplifying circuit of the emitter-follower type according to the present invention. Between the collector of a power amplifying first transistor $Q_{11}$ and a second supply voltage source $+V_2$ is connected a switching second transistor $Q_{12}$ in series with the first transistor. The emitter of the first transistor $Q_{11}$ is connected to a load resistor $R_L$, and between this emitter and the base of said second transistor $Q_{12}$ is connected a biasing voltage source $+E_2$. Accordingly, the base biasing voltage of the second transistor $Q_{12}$ will vary in accordance with the variation of output voltage $e_o$ of the power amplifying circuit, i.e. the input signal voltage $e_i$. Also, between the collector of the first power amplifying transistor $Q_{11}$ and a first voltage supply source $+V_1$ is connected a diode $D_{11}$ intended for blocking the reverse current flow. The base biasing voltage source of the first transistor $Q_{11}$ is not shown.

Description will hereunder be made of the switching of the supply voltage sources which is employed in the present invention.

In the circuit arrangement of FIG. 3 stated above, it should be understood that, in the state of operation where the level of the input signal voltage $e_i$ is low, i.e. in the state of $e_i + E_2 \leq V_1$, the switching second transistor $Q_{12}$ is not rendered conductive, and accordingly there is applied to the collector of the power amplifying first transistor $Q_{11}$ the voltage of the first supply voltage source $+V_1$ via the diode $D_{11}$. When, however, the level of the input signal voltage $e_i$ becomes higher, i.e. $e_i + E_2 > V_1$, there is applied a forward biasing voltage between the base and the emitter of the switching second transistor $Q_{12}$ so that this transistor $Q_{12}$ is rendered conductive. As a result, the collector of the power amplifying first transistor $Q_{11}$ is connected to the second high voltage supply source $+V_2$ via this switching second transistor $Q_{12}$. Let us now explain the input signal level at which the "on-off" switching is carried out by the switching transistor $Q_{12}$. The base-emitter voltage $V_{BE}$ of the switching transistor $Q_{12}$ is expressed by the equation, $$V_{BE} = (e_0 + E_2) - (V_1 - V_D)$$

wherein: $V_D$ represents a forward voltage drop across the diode $D_{11}$.

Let us now assume that the values of $V_{BE}$ and $V_D$ at the time when the switching transistor $Q_{12}$ is conductive are substantially equal to each other. Then, the condition for turning on the transistor $Q_{12}$ will be obtained from the above-mentioned formula, as follows:

$$e_0 + E_2 > V_1.$$

Since the output voltage $e_o$ and the input signal voltage $e_i$ are substantially equal, the condition $e_i + E_2 > V_1$ will become the condition for rendering the switching transistor $Q_{12}$ conductive, as discussed above.

As stated above, in case the input signal level is low, the collector voltage level of the power amplifying first transistor $Q_{11}$ will be low so that the collector loss of this transistor $Q_{11}$ decreases. On the other hand, when the input signal level is high, there is applied a high voltage to the collector of the transistor $Q_{11}$. Thus, it is possible to derive a sufficiently high peak output voltage. Besides, since the transistor $Q_{11}$ is used in the emitter follower connection, even when there arises variations in the supply voltage, there is caused relatively little variation in the operating characteristic between the time at which a small signal is inputted and the time at which a large signal is inputted to the base of the transistor $Q_{11}$.

Figure 2:
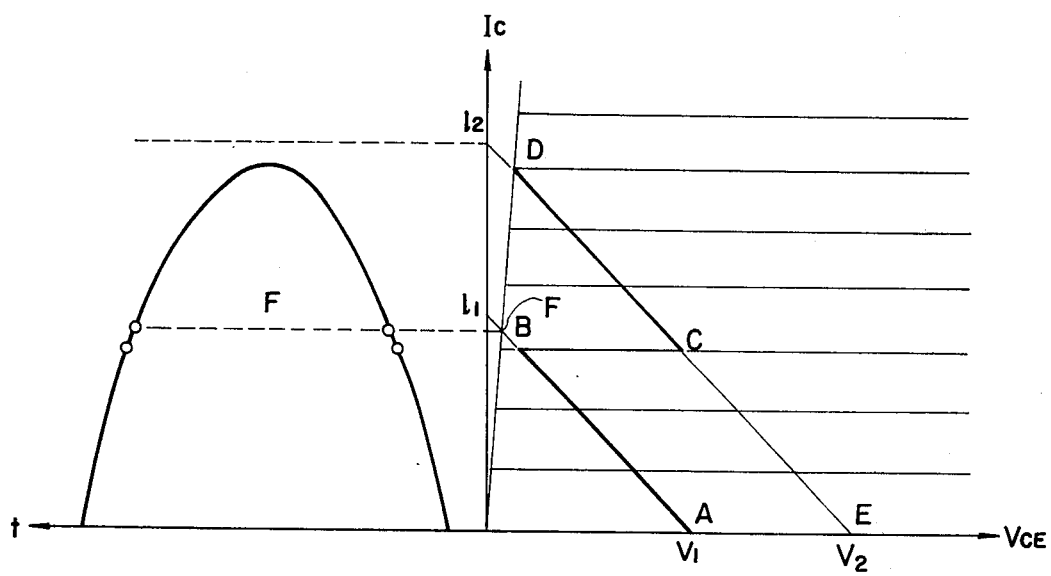
FIG. 2 is a characteristic chart showing the switching operation and the reduction of power loss thereby.

More specifically, let us refer to FIG. 2. During the period in which the output current $I_C$ remains to be small, the amplifier operates in the range A - B on the load line $l_1$. When the output current $I_C$ becomes large, the operation point is translated (switched over) from B to C on another load line $l_2$ so that the amplifier will operate in the ranges A - B on line $l_1$ and C - D on line $l_2$. Thus, there can be saved a power loss by the amount corresponding to the area defined by the parallelogram ABCE. It is to be noted here that the current change does not show any discrete jump at the change-over from line $l_1$ to $l_2$ (or $l_2$ to $l_1$) as can be seen in the lefthand current curve.

Figure 4:
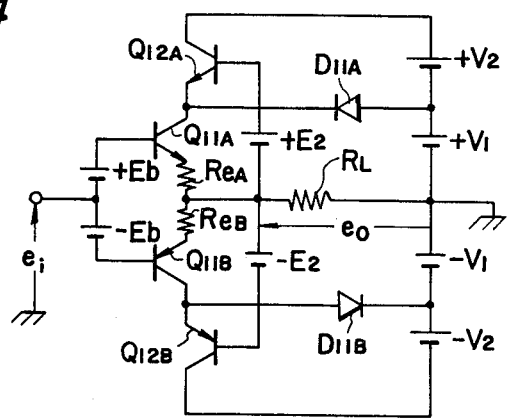
FIG. 4 is a circuit diagram showing a push-pull power amplifying circuit according to another embodiment of the present invention.

FIG. 4 shows a pure complementary single-ended push-pull amplifying circuit of the emitter-follower type embodying the present invention. The collectors of the power amplifier transistors $Q_{11A}$ and $Q_{11B}$ are connected via reverse current blocking diodes $D_{11A}$ and $D_{11B}$ to the positive and negative first supply voltage sources $+V_1$ and $-V_1$, respectively, and further, via switching transistors $Q_{12A}$ and $Q_{12B}$ to the positive and negative supply voltage sources $+V_2$ and $-V_2$, respectively. In this example, the positive and the negative second supply voltage sources $+V_2$ are added upon the positive and the negative first supply voltage sources $+V_1$ and $-V_1$. It should be understood, however, the second supply voltage sources can be independent as shown in FIG. 3. Conversely, in the circuit of FIG. 3, the second supply voltage source $+V_2$ can be added upon the first supply voltage source $+V_1$. Also, between the bases of the switching transistors $Q_{12A}$ and $Q_{12B}$ and the load resistance $R_L$, there are connected base biasing voltage sources $+E_2$ and $-E_2$, respectively. In FIG. 4, symbols $R_{eA}$ and $R_{eB}$ represent resistors for stabilizing the operations of the power amplifying transistors $Q_{11A}$ and $Q_{11B}$. Symbols $+E_b$ and $-E_b$ represent base biasing voltage sources of these transistors $Q_{11A}$ and $Q_{11B}$. The on-off switching condition for the switching transistors $Q_{12A}$ and $Q_{12B}$ in this embodiment can be obtained in the same way as that for the arrangement of FIG. 3. When the input signal level is low, the first supply voltages $+V_1$ and $-V_1$ are connected to the collectors of the power amplifying transistors $Q_{11A}$ and $Q_{11B}$. When this input signal level becomes high, the second supply voltages $+V_2$ and $-V_2$ are further connected to the collectors of these transistors $Q_{11A}$ and $Q_{11B}$.

As stated above, according to the power amplifying circuit embodying the present invention, the switching second transistor is connected in series to the collector of the power amplifying first transistor of the emitter-follower connection which is driven by an input signal, and a biasing voltage which varies in accordance with the emitter voltage of the power amplifying first transistor is applied to the base of the switching second transistor, so that when the input signal level is above or below a certain level which is determined by the aforesaid base-bias voltage, switching second transistor is controlled to be rendered either conductive or non-conductive to thereby vary the supply voltage to the collector of the power amplifying first transistor. Thus, in the normal operation, there is provided the advantage that the collector loss of said power amplifying first transistor can be reduced substantially.

I claim:

1. In a power amplifier of the type wherein the applied source voltage to the amplifier is change in accordance with the voltage level of input signals applied to said amplifier, and including an amplifying transistor for providing to a power amplifier output terminal, an amplified output signal having a voltage level in accordance with said input signal level and further including a switching transistor, each transistor having first, second and control electrodes, said first and second electrodes defining a current path therebetween, conduction by said path being in accordance with the voltage difference between said control electrode and said second electrode, said switching transistor conduction path being connected in series with said amplifying transistor conduction path to selectively couple said amplifying transistor to an auxiliary power source to change thereby said applied source voltage, the improvement wherein:

said switching transistor control electrode is coupled to said power amplifier output terminal such that said switch selectively couples said auxiliary source to said amplifying transistor in accordance with said output signal level.

2. A power amplifier circuit capable of selecting the load lines thereof comprising:

an amplifying transistor of saturating type for amplifying an input signal applied to an input terminal of said power amplifying circuit, and supplying, to an output terminal of said power amplifying circuit, an amplified signal having a level in accordance with the level of said input signal;

voltage supplying means including a first and a second voltage source, each of which supplying, when rendered operative, a respective supply voltage to said amplifying transistor; and selecting circuit means for selecting either one of said first and second voltage sources in response to the level of said amplified signal to render the selected voltage source operative, the selecting circuit means including;

switching means actuated in response to the level of said amplified signal to thereby establish said selecting, a constant voltage source connected between said output terminal and the base of said switching transistor, said constant voltage source delivering a constant voltage specifying a level of said amplified signal at which the change-over between said first and second voltage sources is performed by said selecting circuit means.

3. A power amplifying circuit according to claim 2 wherein:

said switching means further includes a switching diode connected between said first voltage source and said amplifying transistor.

4. A power amplifying circuit according to claim 3 wherein:

said switching transistor has a base connected via a constant voltage source to said output terminal, a collector connected to said second voltage source, and an emitter connected to said amplifying transistor.

5. A power amplifying circuit according to claim 4 wherein:

said amplifying transistor has a base connected to said input terminal, an emitter connected to said output terminal and also to the ground via a load resistor, and a collector connected to the emitter of said switching transistor and also to said first voltage source via said switching diode.

6. A power amplifying circuit according to claim 3 wherein:

said first voltage source is formed with part of said second voltage source.

7. A push-pull power amplifying circuit capable of selecting the load lines thereof, including a pair of circuits each comprising:

an amplifying transistor of saturating type for amplifying an input signal applied to an input terminal of said push-pull power amplifying circuit and supplying an amplified signal having a level in accordance with the level of said input signal to an output terminal of said push-pull power amplifying circuit;

voltage supplying means including a first and a second voltage source, each of which supplying, when rendered operative, a respective supply voltage to said amplifying transistor; and selecting circuit means for selecting one of said first and second voltage sources in response to the level of said amplified signal to rendere thereby the selected voltage source operative, the selecting circuit means including;

switching means actuated in response to the level of said amplified signal to thereby establish said selecting, a constant voltage source connected between said output terminal and the base of said switching transistor, said constant voltage source delivering a constant voltage specifying a level of said amplified signal at which the change-over between said first and second voltage sources is performed by said selecting circuit means.

8. A push-pull power amplifying circuit according to claim 7 wherein:

said switching means further includes a switching diode connected between said first voltage source and said amplifying transistor.

9. A push-pull power amplifying circuit according to claim 8 wherein:

said switching transistor has a base connected via a constant voltage source to said output terminal, a collector connected to said second voltage source, and an emitter connected to said amplifying transistor.

10. A push-pull power amplifying circuit according to claim 9 wherein:

said amplifying transistor has a base connected to said input terminal, an emitter connected to said output terminal and also to the ground via a load resistor, and a collector connected to the emitter of said switching transistor and also to said first voltage source via said switching diode.

11. A push-pull power amplifying circuit according to claim 8 wherein:

said first voltage source is formed with part of said second voltage source.

* * * * *